United States Patent [19]

Murakami et al.

[11] Patent Number: 4,599,069
[45] Date of Patent: Jul. 8, 1986

[54] SUBSTRATE HOLDER FOR MOLECULAR BEAM EPITAXY APPARATUS

[75] Inventors: Shunichi Murakami; Tetsuo Ishida; Junro Sakai, all of Tokyo, Japan

[73] Assignee: Anelva Corporation, Tokyo, Japan

[21] Appl. No.: 706,009

[22] Filed: Feb. 27, 1985

[30] Foreign Application Priority Data

Feb. 27, 1984 [JP] Japan ................................ 59-35829

[51] Int. Cl.$^4$ .................... F27D 5/00; C23C 14/00; F24H 3/00; H01J 37/305
[52] U.S. Cl. ................................ 432/253; 118/50.1; 118/725; 219/354; 219/520; 373/10; 432/226
[58] Field of Search ............... 432/226, 253; 126/375; 373/10, 16, 60; 219/520, 354; 118/50.1, 725

[56] References Cited

U.S. PATENT DOCUMENTS

| | | | |
|---|---|---|---|
| 3,845,738 | 11/1974 | Berkman et al. | 118/725 |
| 4,066,037 | 1/1978 | Jacob | 118/725 |
| 4,356,384 | 10/1982 | Gat | 219/354 |

*Primary Examiner*—John J. Camby
*Attorney, Agent, or Firm*—Laff, Whitesel, Conte & Saret

[57] ABSTRACT

For use in placing a semiconductor substrate in molecular beam epitaxy apparatus, a holder comprises a heat conductor member opposite to a substrate. The substrate is received in a space formed in a supporting member and is in engagement with a flange portion radially inwardly projected from a peripheral surface of the space. The heat conductor member is heated by a heater in the molecular beam epitaxy apparatus. This results in effective conduction of heat to the substrate. The substrate is easily put in the beam epitaxy apparatus and removed therefrom. The heat conductor member may be of pyrolytic graphite or sintered graphite.

17 Claims, 7 Drawing Figures

SUBSTRATE HOLDER FOR MOLECULAR BEAM EPITAXY APPARATUS

BACKGROUND OF THE INVENTION

This invention relates to a substrate holder for molecular beam epitaxy apparatus.

Molecular beam epitaxy is a technique in which single crystal layers are grown by impinging molecular beams of III-V compound semiconductors such as Ga, As, etc. on the heated substrate in ultra high vacuum. Molecular beam epitaxy technique features the following in comparison with the other liquid-phase and vapour-phase epitaxial growth technique:

Low Growth rates permit to control film thickness on a very thin mono layer scale (10 Å).

Low substrate temperatures help to obtain a steep doping profile.

In situ observation of the process of single crystal growth is effective for research on crystal growth mechanism.

These features are incorporated to produce various semiconductor devices, such as the photoconductive wave path, semiconductor laser, photo IC, FET, mixer diode, varactor diode, impatt diode, luminescent semiconductor, super lattice crystal, devices concerning silicon epitaxy, etc.

The molecular beam epitaxy apparatus comprises an epitaxial film growth chamber which is kept at ultra-high vacuum, such as the order of $10^{-10} - 10^{-12}$ Torr, and substrate heating means in the said vacuum chamber. On carrying out the epitaxial film making, the back surface of the substrate is heated by the substrate heating means within the film growth chamber. Molecular beam is emitted from a material source towards the top surface of the substrate for epitaxial film making. Atoms or molecules out of the material source are caused to impinge upon the top surface of the substrate so as to merge or combine with the substrate. The substrate temperature should be kept properly for epitaxial film growth. After the completion of epitaxial film making on the substrate, the substrate is taken out from the film growth chamber and is, then subjected to the other subsequent processes for the semiconductor device fabrication.

In the molecular beam epitaxy method, it is substantially important to keep the temperature of the substrate constant during the epitaxy film making process. To keep the substrate temperature constant and to make the temperature distribution as uniform as possible over the substrate surface is essentially needed for thin film process to provide the superior characteristics of the crystal film.

A substrate holder is used in order to place the substrate at a predetermined position in the film growth chamber. In the prior art, a few types of the substrate holders have been known.

One of the types is constructed so that the substrate may be secured to a supporting member by using adhesive metal of a low melting point. Indium and gallium have mainly been used as the said adhesive metal. In this event, there are several disadvantages as follows. Since it takes a long time for the substrate to be adhered on the supporting member, contamination of the substrate is increased during the said long time substrate preparation. Air bubbles often appear in the said adhesive metal layer between the substrate and the supporting member. Appearance of air bubbles makes it difficult to attain the required ultra-high vacuum in the growth chamber. This is because outgassing occurs from the air bubble portion in the adhesive metal layer. For substrate heating, uniform thermal distribution can not readily be accomplished over the substrate surface if the thickness of the adhesive metal layer is not uniform over the substrate surface area or if it has air bubbles in it. It is essentially important to obtain uniform thermal distribution over the substrate surface. Additionally, outgass from the adhesive metal layer, especially from the air bubble portion causes serious contamination on the growing crystal film. Furthermore, the adhesive metal particle, such as indium, may be evaporated when it is heated. Since the melting point of the adhesive metal is low, such evaporated particle out of the adhesive metal may objectionably merge into the growing film. This leads to uncontrollable and inferior characteristics of the grown crystal film. After completion of the epitaxial film growth, the adhesive metal must be chemically removed from the back surface of the substrate by using some proper acid. This chemical process tends to contaminate the surface of the epitaxially grown film.

In the other type of the substrate holders, the substrate is brought in press contact with a supporting member and fastened by a set of fixing pieces together with the supporting member. The fixing pieces are of fixing metal of high thermal conductivity. When the substrate is heated by the heating means, mechanical stress will remain on the substrate surface due to a difference of expansion coefficients between the substrate and the supporting member of the substrate holder assembly. For the fixing metal, high thermal conductivity material is selected to improve substrate heating efficiency. As a result, thermal distribution does not become uniform. Nonuniform thermal distribution and mechanical stress left on the substrate result in occurrence of crystal defects in the epitaxially grown film.

Among some kinds of crystal defects, linearly localized crystal defect line, which is called "cross-hatch", is used as an evaluation factor for the grown crystal film. The inventors have found out the fact that the crystal defects called cross-hatch mainly occur on the conditions that:

(A) the thermal distribution is not uniform over the substrate surface and (B) mechanical stress remains on the substrate surface.

If both of the conditions are simultaneously and unpleasingly fulfilled, the "cross-hatch" generation is undesiredly accelerated. In addition, the substrate is mounted directly on a substrate holder made of Mo which has high heat resistance and is secured by the use of the fixing pieces with the fixing pieces locally brought into press contact with the substrate. Therefore, the above-mentioned conditions are simultaneously fulfilled at each press contact portion. The crystalline defect seriously appears at the press contact portion in the grown film.

As another type of the substrate holders, a substrate is directly heated without a back metal plate, so as to accomplish a quick thermal response. But, the thermal absorption coefficient of the crystal substrate material, such as GaAs, is extremely low in comparison with other usual metal. Therefore, heating efficiency is not high. Additionally, in this holder, the heating means is locally and mechanically projected onto the substrate back surface and then uniform thermal distribution can not be obtained.

As one another prior art of substrate direct heating, disclosure is made about a back coating with evaporated Mo deposition film (L. P. Erickson et al, International Conference on Molecular Beam Epitaxy, Aug. 1-3, 1983, San Francisco). In this case, Mo was selected by the reason of its high heat resistance or its high melting point. But, Mo film shows high optical reflection factor. To heat the substrate, higher irradiation power of infrared light heating is needed. Higher irradiation power causes undesirably great deal of outgassing from the peripheral portion of heating means. This may lead to higher contamination probability on grown crystal film. This Mo film coating on the back substrate surface requires surplus process for the substrate preparation.

SUMMARY OF THE INVENTION

It is therefore an object of the present invention to provide a substrate holder for molecular beam epitaxy apparatus, which holder is capable of placing without contaminating a semiconductor substrate.

It is another object of this invention to provide a holder of the type described, which is readily capable of holding or removing the substrate.

It is still another object of this invention to provide a holder of the type described, wherein no impurity is produced during heating of the substrate.

It is still another object of this invention to provide a holder of the type described, wherein uniform thermal distribution is provided during the heating of the substrate.

It is still another object of this invention to provide a holder of the type described, wherein no mechanical stress remains in the grown crystal film.

It is still another object of this invention to provide a holder of the type described, wherein occurrence of crystal defects in the grown crystal film is kept as less as possible.

It is still another object of this invention to provide a holder of the type described, wherein post process such as chemically removing of the adhesive metal becomes unnecessary.

A holder to which this invention is applicable is for holding a semiconductor substrate to place the substrate in a molecular beam epitaxy apparatus. The epitaxy apparatus includes heating means for heating the substrate. The substrate has a first surface for epitaxial growth, a second surface opposite to the first surface and directed towards the heating means, and a side surface contiguous to both of the first and second surfaces. According to this invention, the holder comprises a supporting member having an inside surface defining a space for receiving the substrate and a flange portion radially inwardly projected from the inside surface to cover a peripheral portion of the space, and to engage with circumferential portion of the first surface of the substrate. The flange portion thereby maintains the substrate within the space. The holder further comprises a heat conductor member juxtaposed to the second surface of the substrate kept in the space.

DETAILED DESCRIPTION OF PREFERRED EMBODIMENTS

Figure 1:
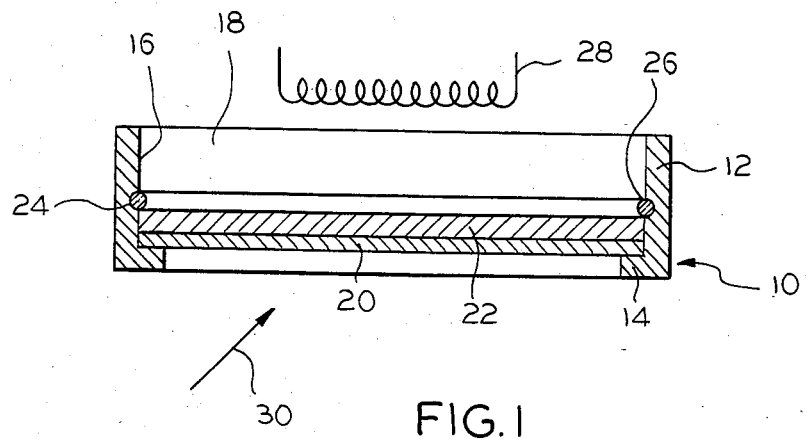
FIG. 1 shows a sectional view of a holder according to a first embodiment of the instant invention and a semiconductor substrate held thereon, together with a heater for heating the substrate.

Referring to FIG. 1, a holder according to a first embodiment of this invention includes a supporting member 10 made of a material comprising pyrolytic graphite or sintered graphite. The supporting member 10 may be of molybdenum. The supporting member 10 has a cylindrical wall portion 12 and a flange portion 14 which is integral with the wall portion 12. An inside surface 16 of the wall portion 12 defines a circular cylindrical space 18 for receiving a semiconductor substrate 20 to be treated by molecular beam epitaxy. The flange portion 14 is radially inwardly projected from a lower end of the wall portion 12 and has an inner diameter which defines an opening in the space. The flange portion 14 may be detachable from the wall portion 12.

The substrate 20 has a circular plate shape and a diameter which is slightly smaller than a diameter of the space 18 but larger enough than the inner diameter of the flange portion 14. When received in the space 18, the substrate 20 is brought into face-to-face contact with the flange portion 14 so as to be thereby supported within the space 18.

The holder further comprises a heat conductor member 22 received in the space 18 and put on the substrate 20. The heat conductor member 22 also has a circular plate shape and is made of a material comprising pyrolytic graphite or sintered graphite. The heat conductor member 22 has a diameter which is substantially equal to the diameter of the substrate 20 so as to nearly wholly cover a top or first surface of the substrate 20.

The inside surface 16 is partially recessed outwardly of the space 18 to form a shallow groove 24. The shallow groove 24 is circularly extended along the inside surface 16 of the wall portion 14. The shallow groove 24 is for receiving a snap ring 26 therein. The snap ring 26 has an outer diameter which is greater than the diameter of the space 18, so that the snap ring 26 is detachably seated by restoring force thereof in the shallow groove 24. The snap ring 26 is partially projected from the shallow groove 24 inside of the space 18 when received in the shallow groove 24. The projected portion of the snap ring 26 serves as a shoulder portion for engagement with the heat conductor member 22 at a circumferential portion of the projected portion. This prevents the heat conductor member 22 from moving upwardly of FIG. 1 in the space 18. On mounting or demounting the substrate 20, the snap ring 26 is detached from the shallow groove 24 of the wall portion 14. Preferably, the snap ring 26 is of molybdenum or tungsten. It is possible to leave an optional gap between the heat conductor member 22 and the snap ring 26.

For carrying out the molecular beam epitaxy, the supporting member 10 is placed in a chamber (not shown) with the substrate 20 supported by the supporting member 10. The chamber is put in a high vacuum after the supporting member 10 is in place. Under the circumstances, an upper surface of the heat conductor member 22 is directed towards a heater 28 while the substrate 20 is directed towards beam source or sources (not shown). Therefore, the heat conductor member 22 can be heated by the heater 28. As a result, the heat of the heater 28 is effectively conducted to the substrate 20 through the heat conductor member 22. On the other hand, a molecular beam 30 is emitted from the beam source to reach a back or second surface of the substrate 20. As a result, atoms or molecules of the beam source are merged and combined with the substrate 20.

Figure 2:
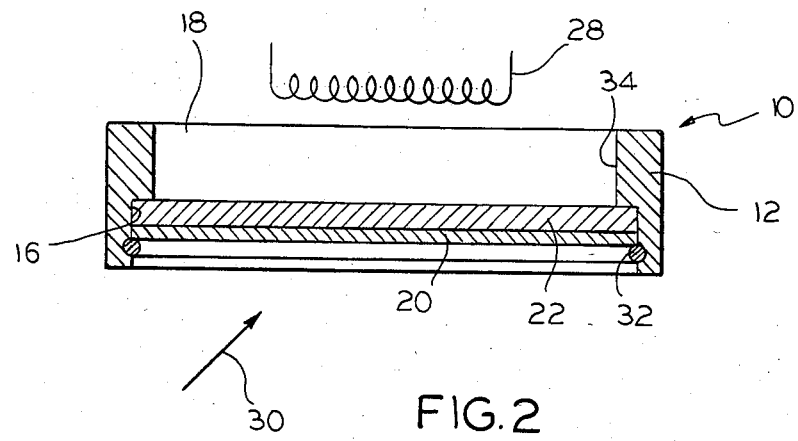
FIG. 2 is a similar view of a holder according to a second embodiment of this invention.

Referring to FIG. 2, a holder according to a second embodiment of this invention comprises similar parts designated by like reference numerals. A supporting member 10 comprises an engaging member 32 detachably secured to the inside surface 16 of the wall portion 12. The engaging member 32 is radially inwardly projected from the wall portion 12 so as to serve as the flange portion described in conjunction with FIG. 1. The engaging member 32 may be of a snap ring which may be similar to that shown in FIG. 1 or may be different therefrom. When the engaging member 32 is circular in cross-section, it will be understood that the substrate 20 is brought in line-to-line contact with the engaging member 32, namely, the flange portion.

The supporting member 10 further comprises a projection 34 which is integral with the wall portion 12 at an upper portion of the heat conductor member 22. The projection 34 is radially inwardly projected from the wall portion 12 so as to serve as the shoulder portion described in conjunction with FIG. 1.

Figure 3:
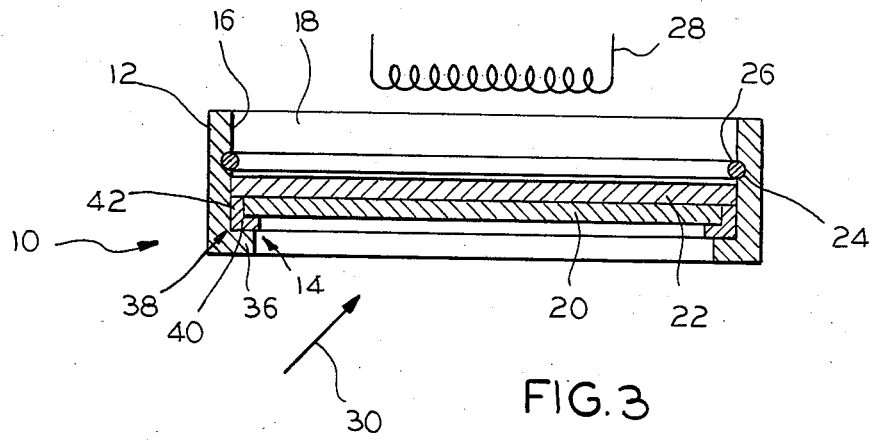
FIG. 3 is a similar view of a holder according to a third embodiment of this invention.

Referring to FIG. 3 which shows a holder according to a third embodiment of this invention, the diameter of the substrate 20 is slightly smaller than that of the heat conductor member 22. As a result, a cylindrical gap is left between the inside surface 16 and the substrate 20. The flange portion 14 comprises a first partial flange 36 integral with the wall portion 12 and an additional conductor member 38 separated from the wall portion 12. The additional conductor member 38 comprises a second partial flange 40 and a cylindrical extension 42 integral therewith. The additional conductor member 38 is of pyrolytic graphite or sintered graphite.

The first partial flange 36 is radially inwardly projected from the inside surface 16 thereof. The second partial flange 40 is intermediate between the first partial flange 36 and the substrate 20 for engaging with the circumferential portion thereof. The cylindrical extension 42 is extended towards the heat conductor member 22 through the cylindrical gap between the inside surface 16 and the substrate 20.

According to the embodiment shown in FIG. 3, the heat emitted from the heater 28 is effectively conducted to the substrate 20 through the additional conductor member 38 in cooperation with the heat conductor member 22. Therefore, the wall portion 12 and the first partial flange 36 may be of a metal material, such as molybdenum, of a high melting point.

Figure 4:
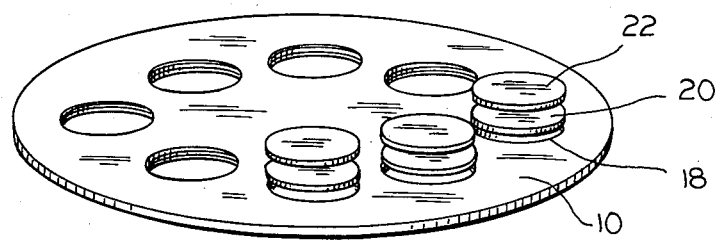
FIG. 4 shows a perspective view of a holder according to a fourth embodiment of this invention, together with a plurality of semiconductor substrates.
Figure 5:
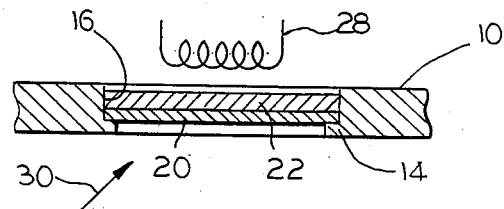
FIG. 5 shows, together with the heater, an enlarged sectional view of a part of the holder shown in FIG. 4, with the substrate held thereon.

Referring to FIGS. 4 and 5 which show another embodiment of this invention, the supporting member 10 is of pyrolytic graphite or sintered graphite and has a circular plate shape. The supporting member 10 may also be of molybdenum. A plurality of spaces 18 are formed in the supporting member 10 and arranged along a circumferential portion thereof. The spaces 18 are for receiving the substrates 20, respectively. Each space 18 is defined by an inside surface 16 (FIG. 5). The flange portion 14 is formed on each of the inside surfaces 16. The flange portion 14 is circularly extended along the inside surface 16 so as to cover a peripheral portion of the space 18. The substrate 20 is received in each of the spaces 18 and is in engagement with each of the flange portions 14. The heat conductor member 22 is superposed on each of the substrates 20 received in the spaces 18. The heat conductor member 22 is of pyrolytic or sintered graphite. According to the embodiment shown in FIGS. 4 and 5, a plurality of substrates 20 can simultaneously be subjected to the molecular beam epitaxy.

Although the heat conductor member 22 is received in the space 18 in all of the above-mentioned embodiments, the heat conductor member 22 may be superposed on an upper end surface of the supporting member 10.

Figure 6:
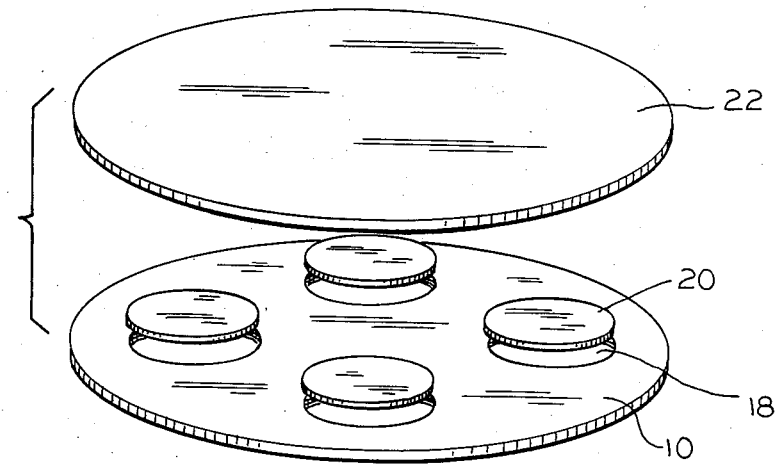
FIG. 6 is an exploded perspective view of a holder according to a fifth embodiment of this invention, together with a plurality of semiconductor substrates.
Figure 7:
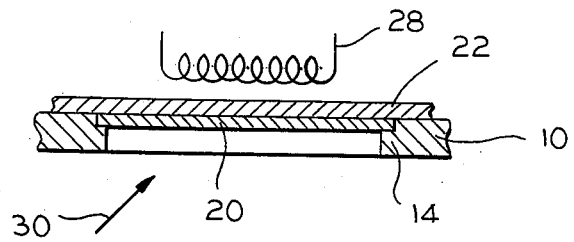
FIG. 7 shows an enlarged partial sectional view of a part of the holder shown in FIG. 6, together with a heater and a substrate held on the holder.

Referring to FIGS. 6 and 7, the diameter of the heat conductor member 22 is substantially equal to a diameter of the supporting member 10 which has a circular plate shape. The heat conductor member 22 is superposed on the upper end surface of the supporting member 10 so as to cover all of a plurality of substrates 20 which are received in the spaces 18, respectively. In this event, it is desirable to support the substrate 20 in the vicinity of the upper end surface of the supporting member 10 so that the substrate 20 is placed near to the heat conductor member 22 as best shown in FIG. 7.

According to the embodiment shown in FIGS. 6 and 7, the heat conductor member 22 may be fixedly placed in the high vacuum chamber. This provides the following advantages. The substrate 20 can be readily mounted on and demounted from the supporting member 10 outside of the chamber. The heat conductor member 22 is not exposed to the atmosphere. This results in a decrease of an amount of impurity gas which will be emitted on heating by the heater 28.

It is desired to restrict the force of contact between the flange portion 14 or 32 and the substrate 20 received thereon so as to prevent a cross hatching, that is, a crystal defect of the substrate 20 by the stress which results from the contact force. When the substrate 20 is in face-to-face contact with the flange portion 14, the contact force should be restricted below about 10 gr/cm$^2$. When the substrate 20 is in line-to-line contact with the flange portion 32, the contact force should be restricted below about 1.5 gr/cm.

The material of the heat conductor member 22 is not limited to those described above. That is, the heat conductor member 22 may be made of another material with a low reflectance. In this event, it is desired for the material that both of heat resistance and heat conductivity are high.

What is claimed is:

1. A holder for holding a semiconductor substrate to place said substrate in a molecular beam epitaxy apparatus, said epitaxy apparatus including heating means for heating said substrate, said substrate having a first surface for epitaxial growth, a second surface opposite to the first surface and directed towards said heating means, and a side surface contiguous to both of the first and second surfaces, said holder comprising:

a supporting member having an inside surface defining a space for receiving said substrate and a flange portion radially projecting inwardly from said inside surface to cover a peripheral portion of said space and to engage a circumferential portion of the first surface of said substrate, said flange portion thereby maintaining said substrate within said space.

2. A holder as claimed in claim 1, wherein said heat conductor member is made of a material comprising pyrolytic graphite.

3. A holder as claimed in claim 1, wherein said heat conductor member is made of a material comprising sintered graphite.

4. A holder as claimed in claim 1, wherein said flange portion is integral with said inside surface.

5. A holder for holding a semiconductor substrate to place said substrate in a molecular beam epitaxy apparatus, said epitaxy apparatus including heating means for heating said substrate, said substrate having a first surface for epitaxial growth, a second surface opposite to the first surface and directed towards said heating means, and a side surface contiguous to both of the first and second surfaces, said holder comprising:
   a supporting member having an inside surface defining a space for receiving said substrate and a flange portion radially projecting inwardly from said inside surface to cover a peripheral portion of said space and to engage a circumferential portion of the first surface of said substrate, said flange portion being detachable from said inside surface, said flange portion thereby maintaining said substrate within said space; and
   a heat conductor member juxtaposed to the second surface of the substrate kept in said space.

6. A holder as claimed in claim 1, further comprising a heat conductor member juxtaposed to the second surface of the substrate kept in said space.

7. A holder as claimed in claim 6, wherein said heat conductor member is received in said space and juxtaposed to the second surface of said substrate.

8. A holder as claimed in claim 7, wherein said heat conductor member has a peripheral surface close to said inside surface.

9. A holder for holding a semiconductor substrate to place said substrate in a molecular beam epitaxy apparatus, said epitaxy apparatus including heating means for heating said substrate, said substrate having a first surface for epitaxial growth, a second surface opposite to the first surface and directed towards said heating means, and a side surface contiguous to both of the first and second surfaces, said holder comprising:
   a supporting member having an inside surface defining a space for receiving said substrate and a flange portion radially projecting inwardly from said inside surface to cover a peripheral portion of said space and to engage a circumferential portion of the first surface of said substrate, said supporting member further comprises a shoulder portion radially inwardly projected from said inside surface of said supporting member, said flange portion thereby maintaining said substrate within said space; and
   a heat conductor member received in said space and juxtaposed to the second surface of the substrate kept in said space, said heat conductor member having a peripheral surface close to said inside surface.

10. A holder as claimed in claim 9, wherein said shoulder portion is integral with said inside surface.

11. A holder as claimed in claim 9, wherein said shoulder portion is detachable from said inside surface.

12. A holder as claimed in claim 1, wherein said flange portion is circularly extended along said inside surface.

13. A holder as claimed in claim 12, wherein said flange portion is in face-to-face contact with said substrate.

14. A holder as claimed in claim 12, wherein said flange portion is in line-to-line contact with said substrate.

15. A holder for holding a semiconductor substrate to place said substrate in a molecular beam epitaxy apparatus, said epitaxy apparatus including heating means for heating said substrate, said substrate having a first surface for epitaxial growth, a second surface opposite to the first surface and directed towards said heating means, and a side surface contiguous to both of the first and second surfaces, said holder comprising:
   a supporting member having an inside surface defining a space for receiving said substrate and a flange portion radially projecting inwardly from said inside surface to cover a peripheral portion of said space and to engage a circumferential portion of the first surface of said substrate, said flange portion thereby maintaining said substrate within said space; and
   a heat conductor member juxtaposed to the second surface of the substrate kept in said space, said substrate being smaller in size than said space and being kept by said supporting member with a gap left between said inside surface and the side surface, wherein said flange portion comprises a first partial flange radially projecting inwardly from said inside surface, a second partial flange intermediate between said first partial flange and said substrate for engaging with said circumferential portion of said second partial flange, and an extension extended towards said heat conductor member in said gap.

16. A holder for holding a plurality of semiconductor substrates to place said substrates in a molecular beam epitaxy apparatus, said epitaxy apparatus including heating means for heating said substrates, each of said substrates having a first surface for epitaxial growth and a second surface opposite to the first surface and directed towards said heating means, said holder comprising:
   a supporting member having a plurality of inside surfaces, defining spaces for receiving the respective substrates, a plurality of flange portions which are radially inwardly projected from the respective inside surfaces to cover peripheral portions of the respective spaces and to engage with circumferential portions of the first surfaces of the respective substrates, said flange portions thereby maintaining said substrates within said spaces, respectively; and
   a plurality of heat conductor members juxtaposed to the second surfaces of the substrates kept in said spaces, respectively.

17. A holder for holding a plurality of semiconductor substrates to place said substrates in a molecular beam epitaxy apparatus, said epitaxy apparatus including heating means for heating said substrates, each of said substrates having a first surface for epitaxial growth and a second surface opposite to the first surface and directed towards said heating means, said holder comprising:
- a supporting member having a plurality of inside surfaces, defining spaces for receiving the respective substrates, a plurality of flange portions which are radially inwardly projected from the respective inside surfaces to cover peripheral portions of the respective spaces and to engage with circumferential portions of the first surfaces of the respective substrates, said flange portions thereby maintaining said substrates within said spaces, respectively; and
- a heat conductor member superposed on said supporting member in common to said substrates and juxtaposed to the second surfaces of the substrates.

* * * * *